(12) United States Patent
Lin et al.

(10) Patent No.: US 7,470,862 B2
(45) Date of Patent: Dec. 30, 2008

(54) SIGNAL TRANSMISSION CABLE ADAPTED TO PASS THROUGH HINGE ASSEMBLY

(75) Inventors: Gwun-Jin Lin, Taoyuan (TW); Chih-Heng Chuo, Taoyuan (TW); Kuo-Fu Su, Taoyuan (TW)

(73) Assignee: Advanced Flexible Circuits Co., Ltd., Taoyuan (TW)

( * ) Notice: Subject to any disclaimer, the term of this patent is extended or adjusted under 35 U.S.C. 154(b) by 560 days.

(21) Appl. No.: 11/206,063

(22) Filed: Aug. 18, 2005

(65) Prior Publication Data

US 2006/0042820 A1 Mar. 2, 2006

(30) Foreign Application Priority Data

Aug. 27, 2004 (TW) ............... 93125823 A

(51) Int. Cl.
*H01B 7/00* (2006.01)
(52) U.S. Cl. ............... 174/117 R; 174/117 F; 174/117 FF
(58) Field of Classification Search ............ 174/117 R, 174/117 F, 117 FF, 256; 439/67, 77, 492–499, 439/580, 581
See application file for complete search history.

(56) References Cited

U.S. PATENT DOCUMENTS

| | | | | |
|---|---|---|---|---|
| 3,296,365 A * | 1/1967 | Basile | ............. | 174/117 FF |
| 3,300,572 A * | 1/1967 | Dahlgren et al. | ............. | 174/69 |
| 3,641,482 A * | 2/1972 | Bretting | ............. | 439/499 |
| 3,818,122 A * | 6/1974 | Luetzow | ............. | 174/86 |
| 3,878,341 A * | 4/1975 | Balde | ............. | 307/113 |
| 4,767,891 A * | 8/1988 | Biegon et al. | ............. | 174/34 |
| 5,262,590 A * | 11/1993 | Lia | ............. | 174/36 |
| 5,691,509 A * | 11/1997 | Balzano | ............. | 174/117 F |
| 6,039,600 A * | 3/2000 | Etters et al. | ............. | 439/496 |
| 6,266,238 B1* | 7/2001 | Paulsel et al. | ............. | 361/683 |
| 6,344,616 B1* | 2/2002 | Yokokawa | ............. | 174/117 F |
| 6,433,284 B1* | 8/2002 | Lin et al. | ............. | 174/254 |
| 6,447,314 B1* | 9/2002 | Kato et al. | ............. | 439/165 |
| 6,885,549 B2* | 4/2005 | Thomason | ............. | 361/683 |
| 7,256,345 B2* | 8/2007 | Inoue | ............. | 174/36 |
| 7,267,552 B2* | 9/2007 | Lin et al. | ............. | 439/67 |

\* cited by examiner

*Primary Examiner*—William H Mayo, III
(74) *Attorney, Agent, or Firm*—Rosenberg, Klein & Lee

(57) ABSTRACT

A signal transmission cable is adapted to pass through a hinge assembly and includes a flexible circuit substrate. A first connection section is formed at a first end of the flexible circuit substrate and has a plurality of signal transmission lines provided thereon. A second connection section is formed at a second end of the flexible circuit substrate and has a plurality of signal transmission lines provided thereon. The cable further has a cluster section formed on the flexible circuit substrate between the first and the second connection sections, and has a plurality of signal transmission lines provided thereon to respectively connect at two ends to the signal transmission lines on the first and the second connection sections. The cluster section includes a plurality of clustered flat cables formed by cutting the flexible circuit substrate along a plurality of parallel cutting lines extended in the lengthwise direction of the flexible circuit substrate.

9 Claims, 8 Drawing Sheets

SIGNAL TRANSMISSION CABLE ADAPTED TO PASS THROUGH HINGE ASSEMBLY

FIELD OF THE INVENTION

The present invention relates to a signal transmission flat cable, and more particularly to a signal transmission flat cable suitable to pass through hinge assembly.

BACKGROUND OF THE INVENTION

A conventional flat cable includes a plurality of parallelly arranged insulated conductors, and is used in various kinds of electrical appliances, electronic apparatus, computers, and communication apparatus to transmit signals. While the conventional flat cable works well when being used between two fixed connecting elements, it could not be satisfactorily used with pivoting mechanisms.

However, pivoting mechanisms are often employed in many currently available electronic apparatus and communication apparatus. For example, the currently widely accepted mobile phones usually include a cover or a screen connected to a main unit of the mobile phone via a pivoting mechanism. At present, a miniaturized flat cable or a cluster of very fine conductors is used as a signal transmission cable to transmit electric signals from the main unit to the screen of the mobile phone.

While the miniaturized flat cable and the cluster of very fine conductors may be used as an alternative for transmitting signals via the mobile phone, they do not permit the hinge assemblies for the flat cable or the cluster of fine conductors to be reduced in size. In other words, the large-size hinge assemblies would form a limit in designing the main unit of the mobile phone. On the other hand, more and more mobile phones or notebook computers are designed to transmit signals via hinge assemblies, the sizes of the hinge assemblies become smaller and smaller, and the pivoting mechanisms have developed from a simple one-dimensional structure to a two-dimensional structure. And, the conventional flat cable no longer meets these requirements. When the conventional flat cable is used with the existing size-reduced pivoting mechanism, it would adversely affect the operation of the pivoting mechanism. The conductors included in the flat cable tend to twist or tangle with one another during the operation of the pivoting mechanism. In a worse condition, some of the conductors in the flat cable would become damaged.

It is therefore necessary to develop a signal transmission flat cable that could be satisfactorily used in electronic apparatus and communication equipment having pivoting mechanisms provided therein.

SUMMARY OF THE INVENTION

A primary object of the present invention is to provide a signal transmission flat cable that is suitable for extending through a pivoting mechanism, and can therefore be used in electronic apparatus having small-size hinge assemblies or being used to transmit a large amount of signals.

Another object of the present invention is to provide a signal transmission flat cable that includes a cluster section consisting of a plurality of clustered flat cables, each of which is independently freely bendable to enable the signal transmission flat cable to extend through holes on a one-dimensional or a two-dimensional pivoting mechanism in an electronic apparatus without adversely affecting the operation of the pivoting mechanism.

To achieve the aforementioned objectives, the present invention provides a signal transmission cable adapted to pass through a hinge assembly includes a flexible circuit substrate; a first connection section formed at a first end of the flexible circuit substrate and having a plurality of signal transmission lines provided thereon; a second connection section formed at a second end of the flexible circuit substrate and having a plurality of signal transmission lines provided thereon; and a cluster section formed on the flexible circuit substrate between the first and the second connection section, and having a plurality of signal transmission lines provided thereon to connect at two ends to the signal transmission lines on the first and the second connection section, respectively. The cluster section includes a plurality of clustered flat cables, which are formed by cutting the flexible circuit substrate along a plurality of paralleled cutting lines extended in the lengthwise direction of the flexible circuit substrate.

The signal transmission flat cable of the present invention may be applied to many electronic apparatus having a one-dimensional or two-dimensional pivoting mechanism provided thereon. For example, the signal transmission flat cable of the present invention may be used in a mobile phone having a pivoting mechanism. When a screen of the mobile phone is pivotally turned forward and backward and then slewed relative to a main unit of the mobile phone, the clustered flat cables of the cluster section of the flat cable of the present invention extended through the pivoting mechanism are independently and freely bendable without twisting or tangling with one another to become damaged due to the turning operation of the pivoting mechanism. The flat cable of the present invention would not adversely affect the operation of the pivoting mechanism, either.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
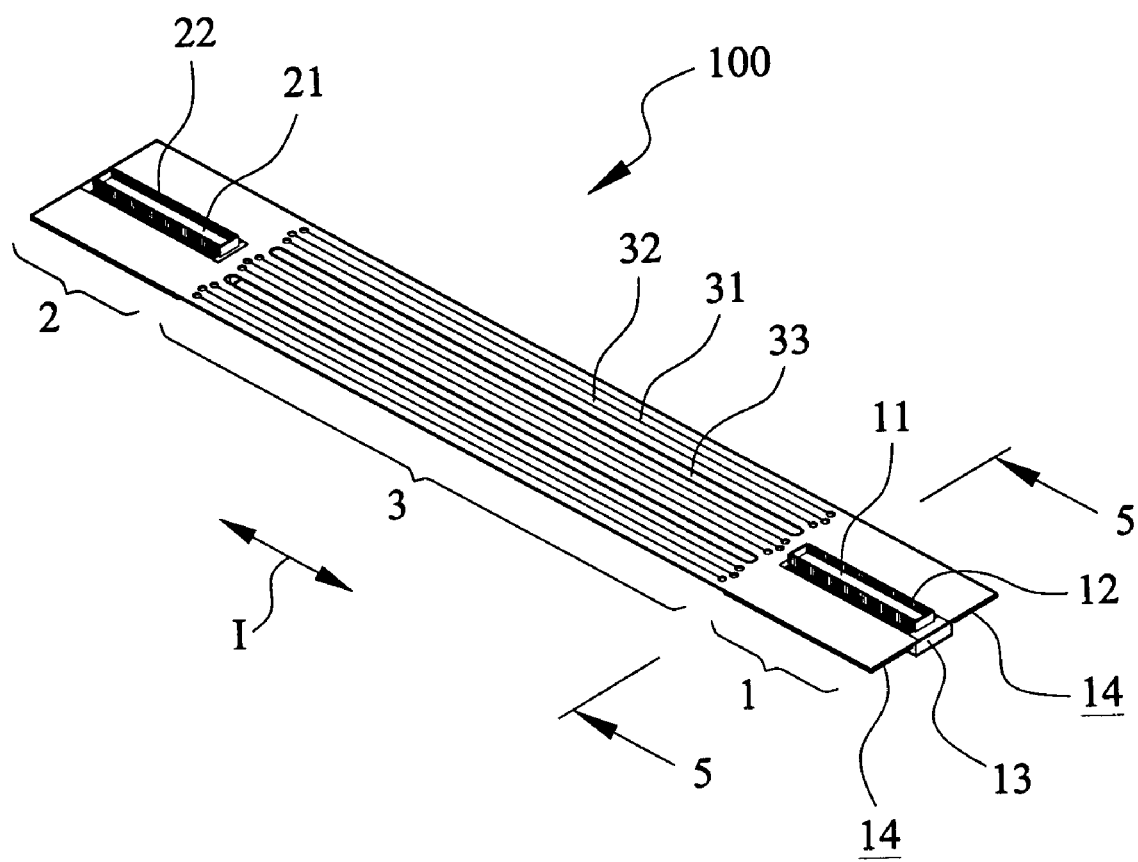
FIG. 1 is a developed perspective view of a signal transmission cable adapted to pass through a hinge assembly according to the present invention.
Figure 2:
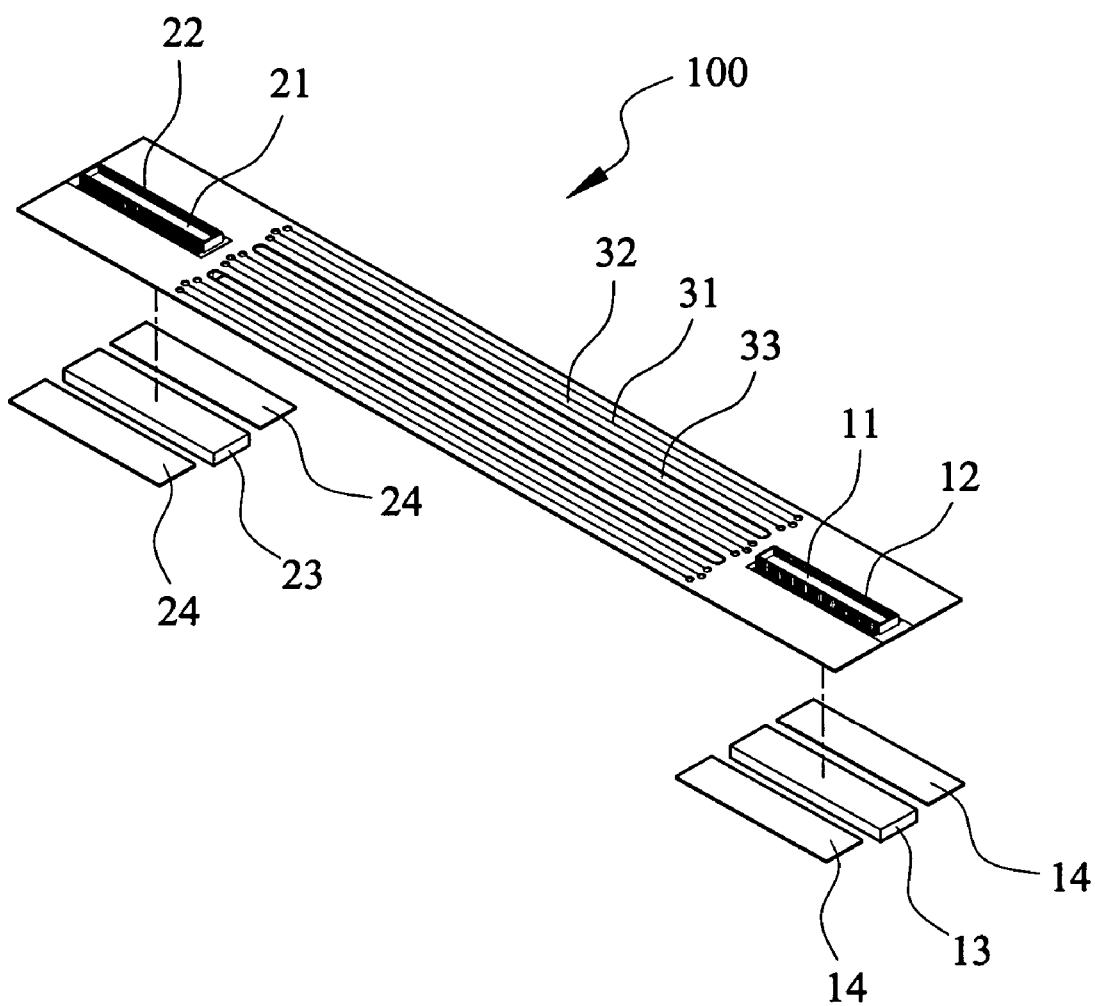
FIG. 2 is a partially exploded view of FIG. 1 showing insulating plates and adhering layers provided at a lower surface of the flat cable.

Please refer to FIG. 1 that is a developed perspective view of a signal transmission flat cable 100 according to the present invention and to FIG. 2 that is a partially exploded perspective view of FIG. 1. As shown, the flat cable 100 includes a first connection section 1, a second connection section 2, and a cluster section 3 located between the first and the second connection section 1, 2. Each of the three sections 1, 2, and 3 is provided at an upper surface with a plurality of signal transmission lines. The signal transmission lines on the cluster section 3 are connected at two ends to the signal transmission lines correspondingly provided on the first and the second connection section 1, 2. The first connection section 1 is provided at the upper surface with a first connector 11, on two lateral sides of which a plurality of contact pins 12 are provided, and at a lower surface with an insulating plate 13 and a pair of adhering layers 14 located at two lateral sides of the insulating plate 13. Similarly, the second connection section 2 is provided at the upper surface with a second connector 21, on two lateral sides of which a plurality of contact pins 22 are provided, and at a lower surface with an insulating plate 23 and a pair of adhering layers 24 located at two lateral sides of the insulating plate 23. More specifically, the contact pins 12, 22 on the first and the second connector 11, 21, respectively, are connected to two ends of the signal transmission lines on the cluster section 3 of the flat cable 100.

Figure 3:
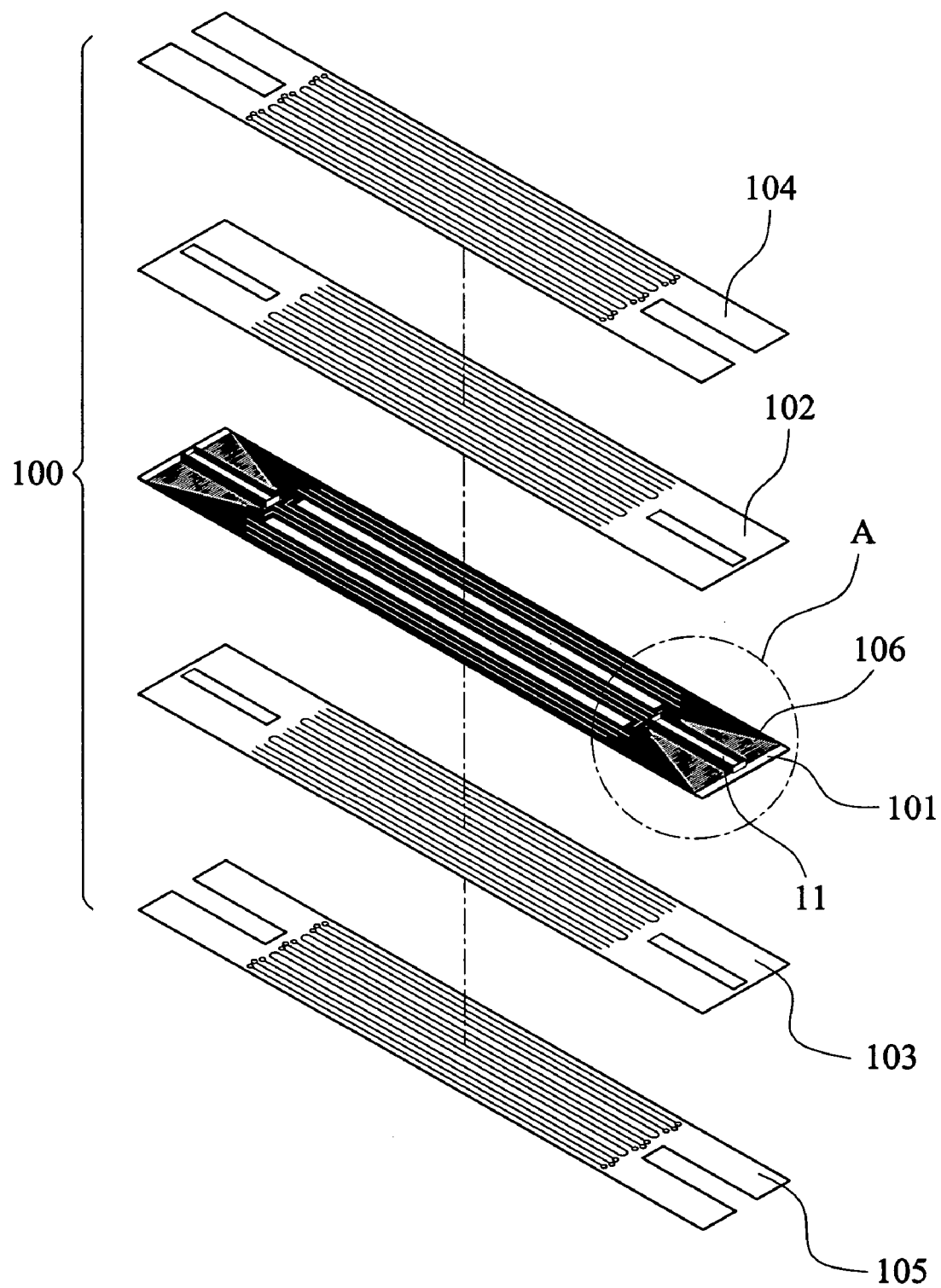
FIG. 3 is an exploded perspective view of the flat cable of the present invention.
Figure 4:
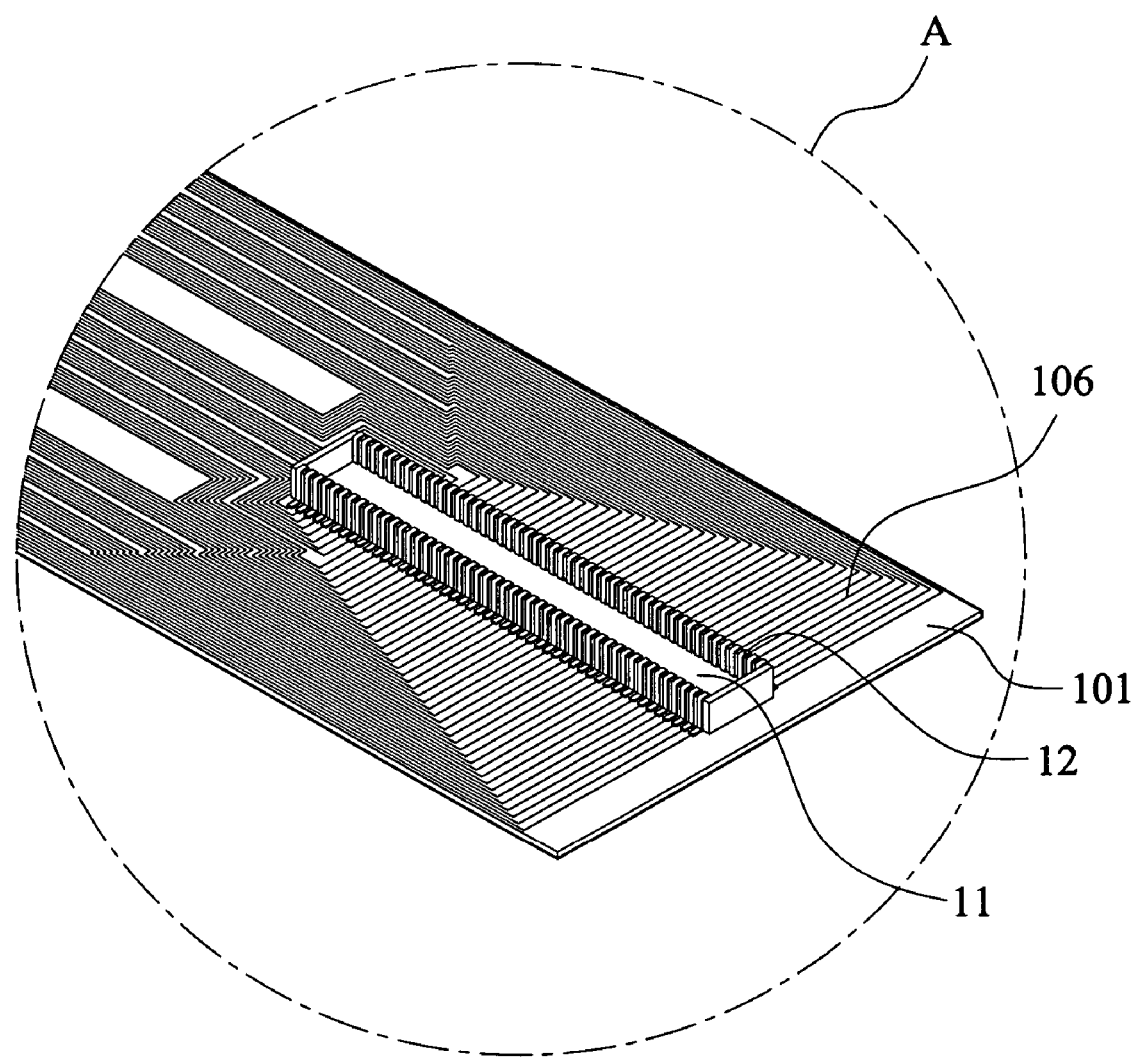
FIG. 4 is an enlarged view of the circled area A of FIG. 3.

FIG. 3 is an exploded perspective view showing a laminated structure of the flat cable 100. As shown, the flat cable 100 is formed from multiple laminated layers, including a flexible circuit substrate 101, an upper and a lower insulating layer 102, 103 located at an upper and a lower side, respectively, of the flexible circuit substrate 101, and an upper and a lower shielding layer 104, 105 located at an upper side of the upper insulating layer 102 and a lower side of the lower insulating layer 103, respectively. A plurality of signal transmission lines 106 are provided on a top of the flexible circuit substrate 101 using currently available circuitry techniques. The flexible circuit substrate 101 has a first end forming the first connection section 1 and a second end forming the second connection section 2. As can be seen from FIG. 4, which is an enlarged view of the circled area A of FIG. 3, each of the signal transmission lines 106 is connected at two ends to one first and one second contact pins 12, 22 correspondingly provided on the first connector 11 and the second connector 21 on the first and the second connection section 1, 2, respectively.

The cluster section 3 is formed in a middle section of the flexible circuit substrate 101 between the first and the second connection section 1, 2, and includes a plurality of clustered flat cables 32, which are formed by cutting the flexible circuit substrate 101 of the flat cable 100 along a plurality of paralleled cutting lines 31 extended in the lengthwise direction I of the flat cable 100 (see FIG. 1). Each of the clustered flat cables 32 internally includes at least one signal transmission line. In addition to the paralleled cutting lines 31, there are also two long folding slots 33 correspondingly formed on the cluster section 3 of the flat cable 100. The flexible circuit substrate 101 of the flat cable 100 may be longitudinally downward folded along the two folding slots 33, such that areas on the first and the second connection section 1, 2 at two lateral sides of the first and the second connector 11, 21, respectively, are also folded downward to locate below the first and the second connector 11, 21.

Figure 5:
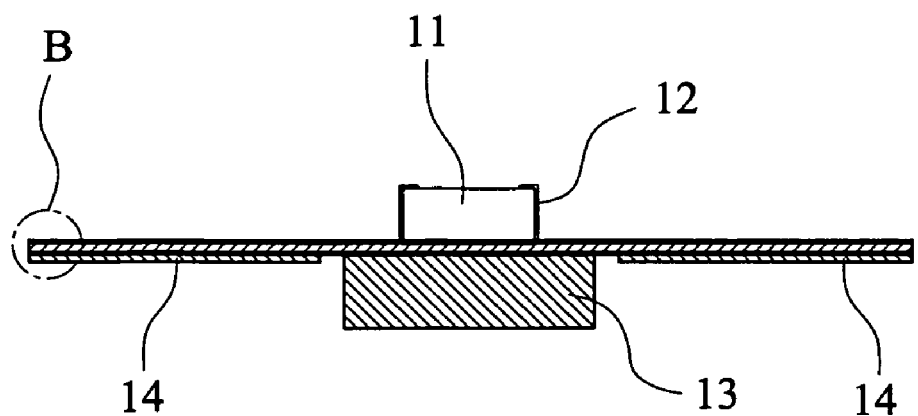
FIG. 5 is a sectional view taken along line 5-5 of FIG. 1.
Figure 6:
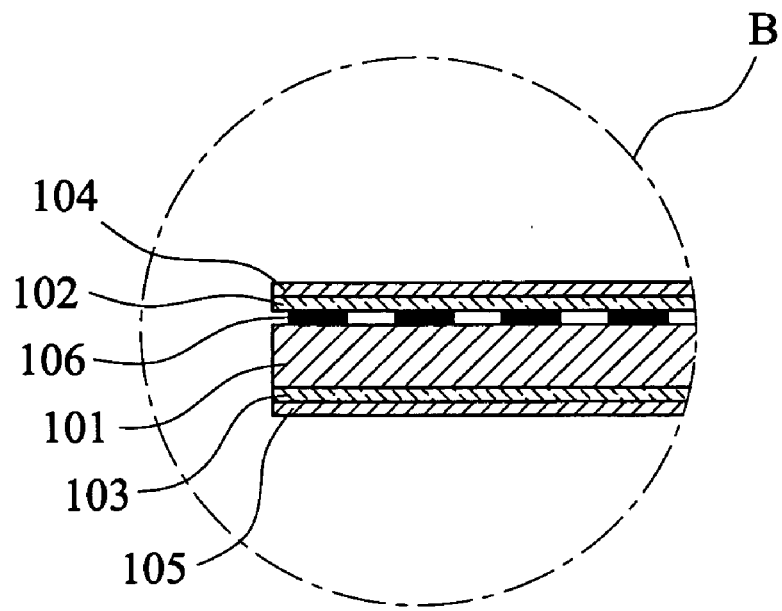
FIG. 6 is an enlarged view of the circled area B of FIG. 5.

FIG. 5 is a sectional view taken along line 5-5 of FIG. 1, in which it is clearly shown the insulating plate 13 is provided at the lower surface of the first connection section 1 immediately below the first connector 11, and the pair of adhering layers 14 are located at two lateral sides of the insulating plate 13. And, FIG. 6 is an enlarged view of the circled area B of FIG. 5 clearly showing the signal transmission lines 106 are provided on the top of the flexible circuit substrate 101 using generally known circuitry techniques, the upper insulating layer 102 and the upper shielding layer 104 are sequentially provided at the upper side of the flexible circuit substrate 101, and the lower insulating layer 103 and the lower shielding layer 105 are sequentially provided at the lower side of the flexible circuit substrate 101. The upper and the lower shielding layer 104, 105 may be made of, for example, aluminum foil.

Figure 7:
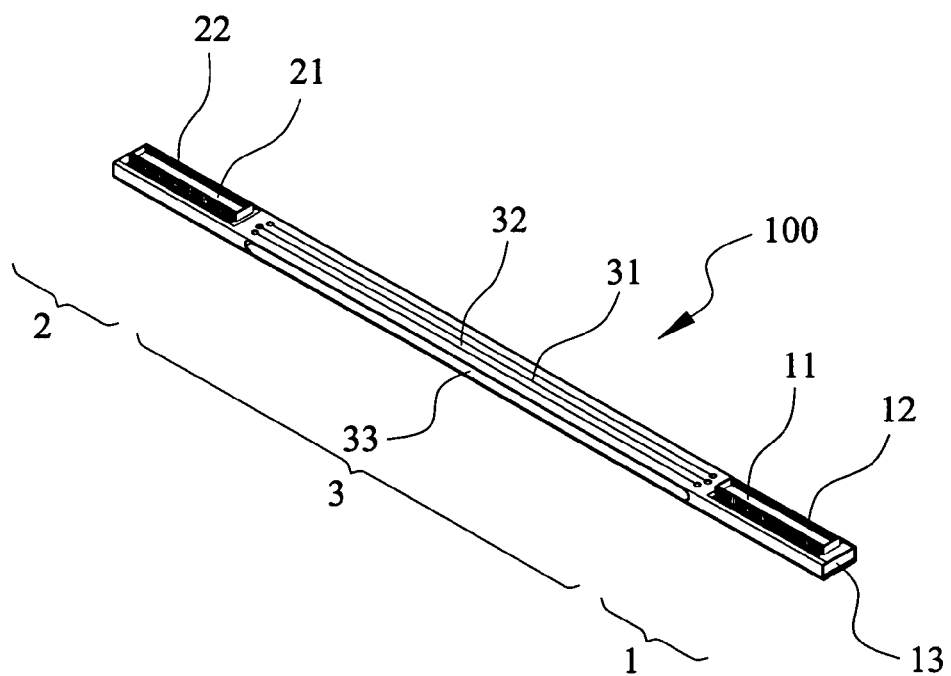
FIG. 7 is a perspective view of the flat cable of the present invention.

FIG. 7 is an assembled perspective view of the flat cable 100 of the present invention. As shown, the developed cluster section 3 shown in FIG. 1 has been longitudinally downward folded along the long folding slots 33, and the areas on the first and the second connection section 1, 2 at two lateral sides of the first and the second connector 11, 21, respectively, are folded downward at the same time to overlap with each other and bear against a bottom of the insulting plate 13, 23 via the adhering layers 14, 24, respectively.

With the above arrangements, the first and the second connection section 1, 2 of the flat cable 100 are in a form suitable for extending through a small bore or a small space provided on a pivoting mechanism. Meanwhile, since the cluster section 3 of the flat cable 100 is cut along multiple paralleled cutting lines 31 to form a plurality of clustered flat cables 32, and these clustered flat cables 32 are independently and freely bendable, the cluster section 3 may be easily extended through the pivoting mechanism without being adversely affected or hindered by the turning of the pivoting mechanism.

Figure 8:
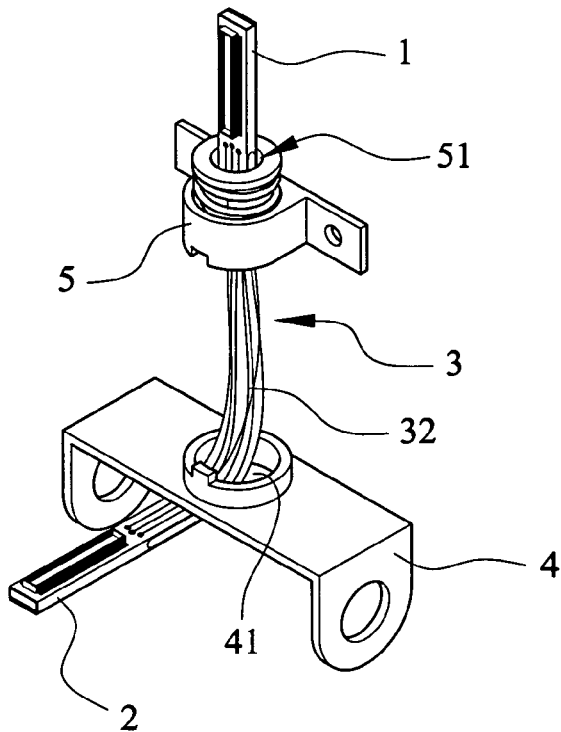
FIG. 8 is a partially exploded perspective view showing the flat cable of the present invention being extended through a pivoting mechanism.

FIG. 8 is an exploded perspective view showing the flat cable 100 of the present invention is extended through a pivoting mechanism. As shown, the first and the second connection section 1, 2 of the flat cable 100 can be easily extended through a hole 41 on a first hinge assembly 4 and a hole 51 on a second hinge assembly 5, respectively, for the cluster section 3 to locate in and between the holes 41, 51 without being hindered by the turning of the first and the second turning element 4, 5.

Figure 9:
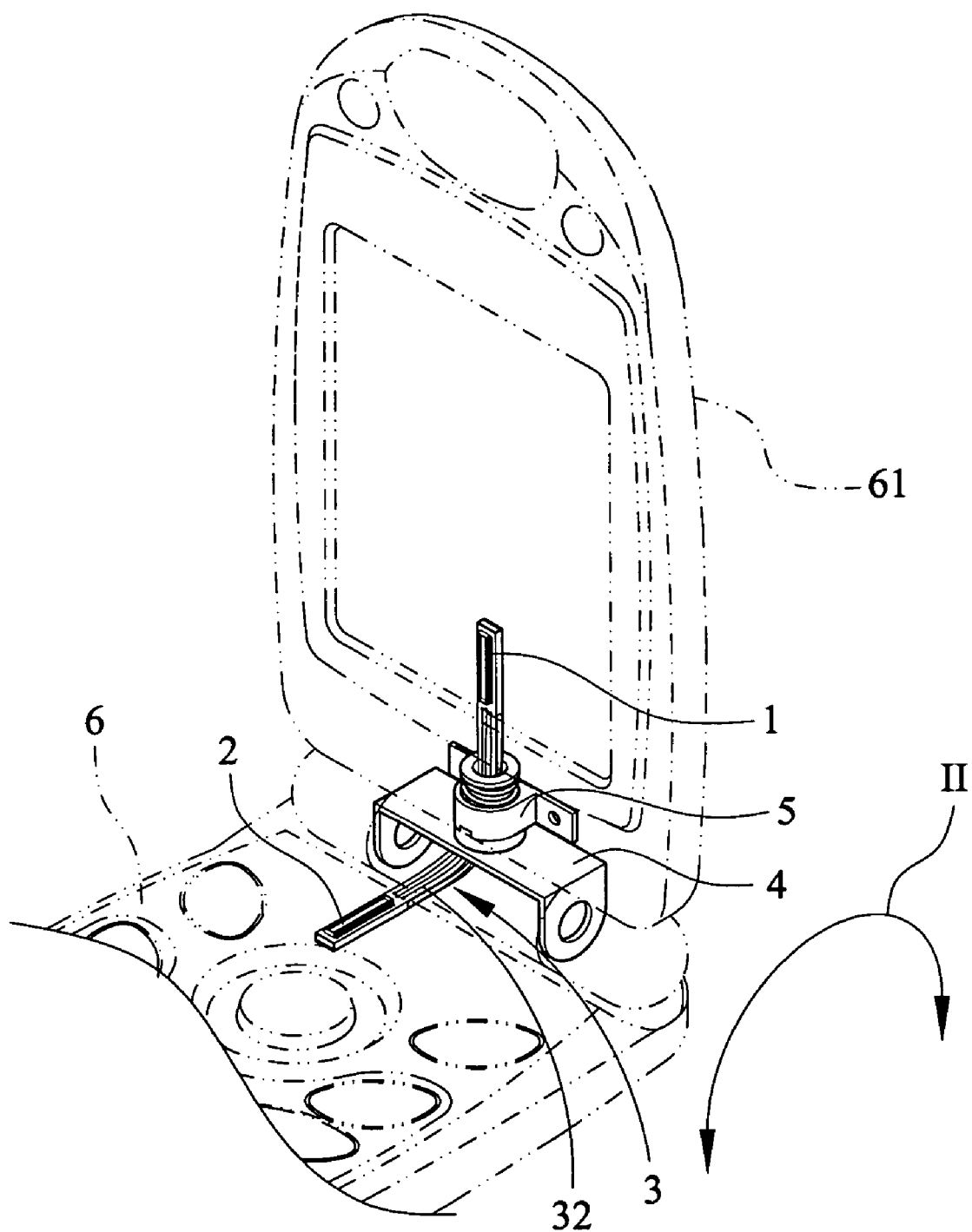
FIG. 9 shows the flat cable of the present invention is used in a mobile phone having a one-dimensional pivoting mechanism.

The flat cable of the present invention may be applied to many different electronic apparatus having pivoting mechanisms. FIG. 9 shows the flat cable 100 is used in a mobile phone having a one-dimensional pivoting mechanism. As shown, the pivoting mechanism has a first hinge assembly 4 connected to an end of a main unit 6 of the mobile phone, and a second hinge assembly 5 connected to an end of a screen 61 of the mobile phone adjacent to the main unit 6. When the screen 61 is pivotally turned forward or backward relative to the main unit 6 as indicated by the arrow II, the flat cable 100 extended through the first and the second hinge assembly 4, 5 is not damaged due to the turning of the screen 61 relative to the main unit 6, and does not affect the operation of the pivoting mechanism.

Figure 10:
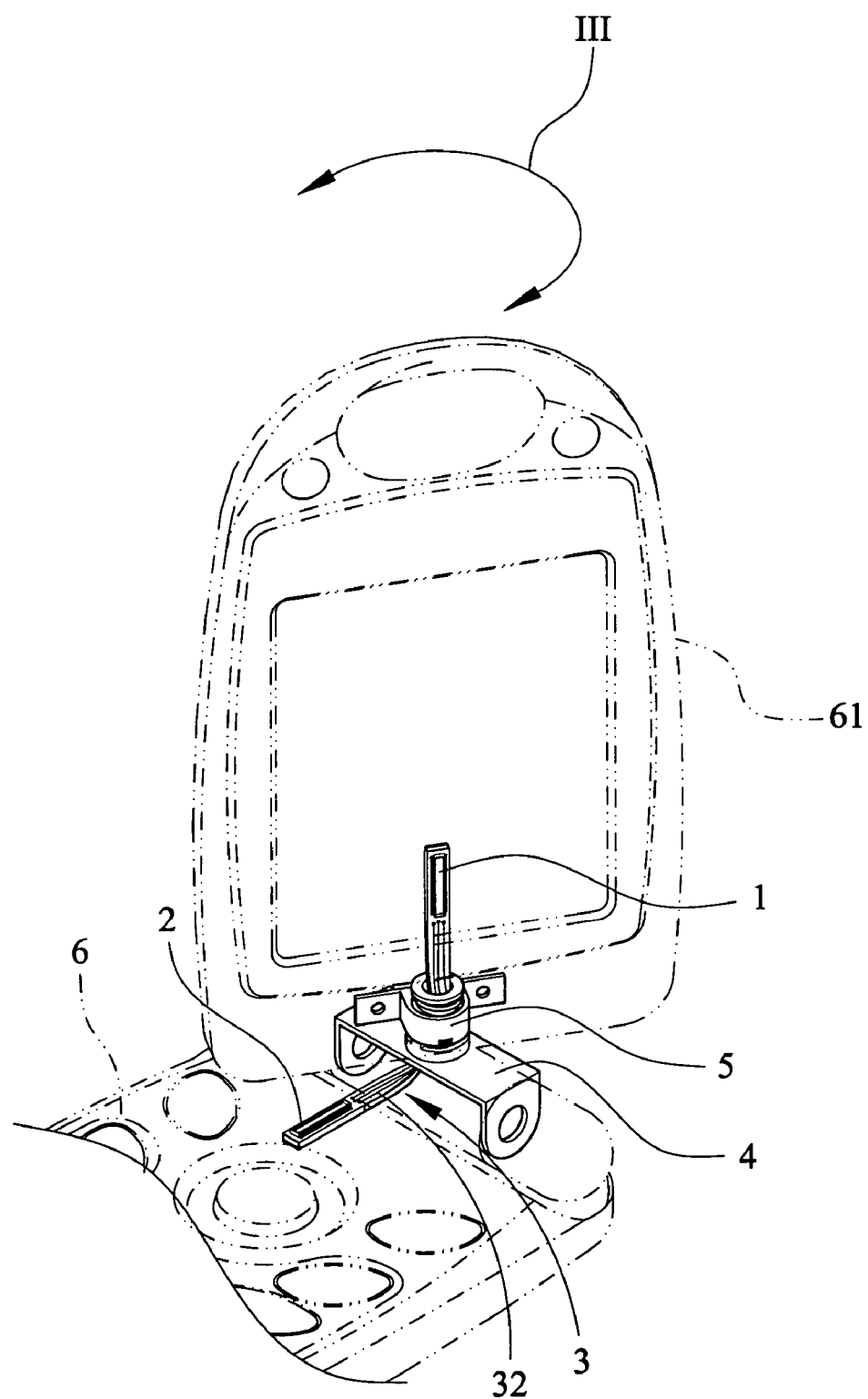
FIG. 10 shows the flat cable of the present invention is used in a mobile phone having a two-dimensional pivoting mechanism.

The flat cable 100 may also be used in an electronic apparatus having a two-dimensional pivoting mechanism. FIG. 10 shows the flat cable 100 is used in a mobile phone having a two-dimensional pivoting mechanism. That is, the screen 61 of the mobile phone may be pivotally turned forward or backward relative to the main unit 6 of the mobile phone as indicated by the arrow II (see FIG. 9), as well as slewed as indicated by the arrow III. When the screen 61 is pivotally turned and then slewed relative to the main unit 6, the flat cable 100 extended through the first and the second hinge assembly 4, 5 is not damaged due to the turning of the screen 61 relative to the main unit 6, and does not affect the operation of the pivoting mechanism.

What is claimed is:

1. A signal transmission cable, comprising:
a flexible circuit substrate provided with a plurality of signal transmission lines;
a first connection section formed at a first end of the flexible circuit substrate and having a plurality of signal transmission lines, the first connection section being provided on a lower surface at two lateral sides with an adhering layer each;
a first connector provided on the first connection section, areas at two lateral sides of the first connector being downward folded to overlap each other below the first connector and being fixed in place via the two adhering layers of the first connection section;
a second connection section formed at a second end of the flexible circuit substrate and having a plurality of signal transmission lines, the second connection section being provided on a lower surface at two lateral sides with an adhering layer each;
a second connector provided on the second connection section, the areas at two lateral sides of the second connector being downward folded to overlap each other below the second connector and being fixed in place via the two adhering layers of the second connection section; and
a cluster section formed at a middle section of the flexible circuit substrate between the first and the second connection section, and having a plurality of signal transmission lines connected at two ends to the signal transmission lines on the first and the second connection section respectively;
the cluster section including a plurality of clustered flat cables, which are formed by cutting the flexible circuit substrate along a plurality of paralleled cutting lines extended in the lengthwise direction of the flexible circuit substrate; the clustered flat cables being independently and freely bendable, and each of the clustered flat cables including at least one signal transmission line therein; and
areas on the first and the second connection section at two lateral sides of the first and the second connector being downward foldable to overlap each other below the first and the second connector, respectively.

2. The signal transmission cable as claimed in claim 1, further comprising two insulating plates provided at a lower surface of the first and the connection section below the first and the second connector, respectively.

3. The signal transmission cable as claimed in claim 1, wherein the flexible circuit substrate further includes a pair of long folding slots in addition to the a plurality of paralleled cutting lines, such that the flexible circuit substrate may be longitudinally folded along the two folding slots for the areas at two lateral sides of the first and the second connection section to be downward folded to overlap each other below the first and the second connector.

4. A signal transmission cable, comprising:
a flexible circuit substrate provided with a plurality of signal transmission lines;
a first connection section formed at a first end of the flexible circuit substrate and having a plurality of signal transmission lines;
a first connector provided on the first connection section;
a second connection section formed at a second end of the flexible circuit substrate and having a plurality of signal transmission lines;
a second connector provided on the second connection section;
a cluster section formed at a middle section of the flexible circuit substrate between the first and the second connection section, and having a plurality of signal transmission lines connected at two ends to the signal transmission lines on the first and the second connection section respectively; and
an upper insulating layer and an upper shielding layer sequentially provided at an upper side of the flexible circuit substrate, and a lower insulating layer and a lower shielding layer sequentially provided at a lower side of the flexible circuit substrate;
the cluster section including a plurality of clustered flat cables, which are formed by cutting the flexible circuit substrate along a plurality of paralleled cutting lines extended in the lengthwise direction of the flexible circuit substrate; the clustered flat cables being independently and freely bendable, and each of the clustered flat cables including at least one signal transmission line therein; and
areas on the first and the second connection section at two lateral sides of the first and the second connector being downward foldable to overlap each other below the first and the second connector, respectively.

5. A signal transmission cable adapted to pass through a hinge assembly having at least one hole, comprising:
a flexible circuit substrate provided with a plurality of signal transmission lines;
a first connection section formed at a first end of the flexible circuit substrate and having a plurality of signal transmission lines, the first connection section being provided on a lower surface at two lateral sides with an adhering layer each;
a second connection section formed at a second end of the flexible circuit substrate and having a plurality of signal transmission lines, the second connection section being provided on a lower surface at two lateral sides with an adhering layer each; and
a cluster section formed at a middle section on the flexible circuit substrate between the first and the second connection section, and having a plurality of signal transmission lines connected at two ends to the signal transmission lines on the first and the second connection section respectively;
said cluster section including a plurality of clustered flat cables, which are formed by cutting the flexible circuit substrate along a plurality of paralleled cutting lines extended in the lengthwise direction of the flexible circuit substrate; the flat cables being independently and freely bendable, and each of the clustered flat cables including at least one signal transmission line therein; and
the cluster section of the flexible circuit substrate being extended through the hole provided on the hinge assembly with the first and the second section located at two opposite sides of the hole on the hinge assembly.

6. The signal transmission cable as claimed in claim 5, wherein the first connection section is provided on an upper surface with a first connector, and the second connection section is provided on an upper surface with a second connector.

7. The signal transmission cable as claimed in claim 6, further comprising two insulating plates provided at a lower surface of the first and the second connection section below the first and the second connector, respectively.

8. The signal transmission cable as claimed in claim 5, wherein the flexible circuit substrate further includes a pair of long folding slots in addition to the a plurality of paralleled cutting lines, such that the flexible circuit substrate may be longitudinally folded along the two folding slots for areas at two lateral sides of the first and the second connection section to be downward folded to overlap each other.

9. A signal transmission cable adapted to pass through a hinge assembly having at least one hole, comprising:
- a flexible circuit substrate provided with a plurality of signal transmission lines;
- a first connection section formed at a first end of the flexible circuit substrate and having a plurality of signal transmission lines;
- a second connection section formed at a second end of the flexible circuit substrate and having a plurality of signal transmission lines;
- a cluster section formed at a middle section on the flexible circuit substrate between the first and the second connection section, and having a plurality of signal transmission lines connected at two ends to the signal transmission lines on the first and the second connection section respectively; and
- an upper insulating layer and an upper shielding layer sequentially provided at an upper side of the flexible circuit substrate, and a lower insulating layer and a lower shielding layer sequentially provided at a lower side of the flexible circuit substrate;
- said cluster section including a plurality of clustered flat cables, which are formed by cutting the flexible circuit substrate along a plurality of paralleled cutting lines extended in the lengthwise direction of the flexible circuit substrate; the flat cables being independently and freely bendable, and each of the clustered flat cables including at least one signal transmission line therein; and
- the cluster section of the flexible circuit substrate being extended through the hole provided on the hinge assembly with the first and the second section located at two opposite sides of the hole on the hinge assembly.

* * * * *